(12) United States Patent
Soe

(10) Patent No.: US 7,068,089 B2
(45) Date of Patent: Jun. 27, 2006

(54) DIGITALLY PROGRAMMABLE I/Q PHASE OFFSET COMPENSATION

(75) Inventor: Zaw Min Soe, Encinitas, CA (US)

(73) Assignee: Wionics Research, Irvine, CA (US)

( * ) Notice: Subject to any disclaimer, the term of this patent is extended or adjusted under 35 U.S.C. 154(b) by 0 days.

(21) Appl. No.: 10/856,075

(22) Filed: May 28, 2004

(65) Prior Publication Data

US 2005/0264335 A1 Dec. 1, 2005

(51) Int. Cl.
*H03H 11/26* (2006.01)

(52) U.S. Cl. ........................ 327/262; 327/268; 327/284

(58) Field of Classification Search ................ 327/261, 327/262, 263, 268, 276–278, 284, 285
See application file for complete search history.

(56) References Cited

U.S. PATENT DOCUMENTS

| | | | | |
|---|---|---|---|---|
| 4,841,500 A | * | 6/1989 | Lee | 368/120 |
| 5,130,564 A | * | 7/1992 | Sin | 327/264 |
| 5,283,631 A | * | 2/1994 | Koerner et al. | 326/121 |
| 5,644,262 A | * | 7/1997 | Bazes | 327/277 |
| 6,407,412 B1 | * | 6/2002 | Iniewski et al. | 257/107 |
| 6,766,157 B1 | * | 7/2004 | Hunzeker et al. | 455/317 |
| 6,798,011 B1 | * | 9/2004 | Adan | 257/312 |
| 2002/0040991 A1 | * | 4/2002 | Embabi et al. | 257/312 |
| 2004/0046600 A1 | * | 3/2004 | Fujimoto et al. | 327/518 |
| 2004/0124892 A1 | * | 7/2004 | Diorio et al. | 327/112 |
| 2004/0263272 A1 | * | 12/2004 | Ravi et al. | 331/177 V |

OTHER PUBLICATIONS

PCT search report for PCT/US05/18435 dated Oct. 24, 2005.

* cited by examiner

*Primary Examiner*—Timothy P. Callahan
*Assistant Examiner*—Hai L. Nguyen
(74) *Attorney, Agent, or Firm*—Foley & Lardner LLP

(57) ABSTRACT

Delays are produced in differential signals using a variable capacitance provided by MOS varactors coupled between the differential signals. The capacitance values of the MOS varactors is controlled by a bias voltage applied to the bodies of the varactors. Selective application of bias voltages to the MOS varactors may be employed to selectively delay one pair of differential signals with respect to another pair of differential signals so as to change the relative phases of the signals. A logic circuit may be used to control the application of bias voltage to the MOS varactors so that signal phases may be adjusted in a manner that is predictable and programmable. These methods may be implemented to compensate for phase offsets between in-phase and quadrature signals of a local oscillator.

25 Claims, 7 Drawing Sheets

| Phase Error Correction Value | I signal varactor array states | | | | | Q signal varactor array states | | | | | Phase adjustment (degrees) |
|---|---|---|---|---|---|---|---|---|---|---|---|
| | Set 5 | Set 4 | Set 3 | Set 2 | Set 1 | Set 5 | Set 4 | Set 3 | Set 2 | Set 1 | |
| 000000 | 1 | 1 | 1 | 1 | 1 | 0 | 0 | 0 | 0 | 0 | 6.78125 |
| 000001 | 1 | 1 | 1 | 1 | 1 | 0 | 0 | 0 | 0 | 1 | 6.56250 |
| 000010 | 1 | 1 | 1 | 1 | 1 | 0 | 0 | 0 | 1 | 0 | 6.34375 |
| 000011 | 1 | 1 | 1 | 1 | 1 | 0 | 0 | 0 | 1 | 1 | 6.125 |
| 000100 | 1 | 1 | 1 | 1 | 1 | 0 | 0 | 1 | 0 | 0 | 5.90625 |
| 000101 | 1 | 1 | 1 | 1 | 1 | 0 | 0 | 1 | 0 | 1 | 5.6875 |
| 000110 | 1 | 1 | 1 | 1 | 1 | 0 | 0 | 1 | 1 | 0 | 5.46875 |
| 000111 | 1 | 1 | 1 | 1 | 1 | 0 | 0 | 1 | 1 | 1 | 5.25 |
| 001000 | 1 | 1 | 1 | 1 | 1 | 0 | 1 | 0 | 0 | 0 | 5.03125 |
| 001001 | 1 | 1 | 1 | 1 | 1 | 0 | 1 | 0 | 0 | 1 | 4.8125 |
| 001010 | 1 | 1 | 1 | 1 | 1 | 0 | 1 | 0 | 1 | 0 | 4.59375 |
| 001011 | 1 | 1 | 1 | 1 | 1 | 0 | 1 | 0 | 1 | 1 | 4.375 |
| 001100 | 1 | 1 | 1 | 1 | 1 | 0 | 1 | 1 | 0 | 0 | 4.15625 |
| 001101 | 1 | 1 | 1 | 1 | 1 | 0 | 1 | 1 | 0 | 1 | 3.9375 |
| 001110 | 1 | 1 | 1 | 1 | 1 | 0 | 1 | 1 | 1 | 0 | 3.71875 |
| 001111 | 1 | 1 | 1 | 1 | 1 | 0 | 1 | 1 | 1 | 1 | 3.5 |
| 010000 | 1 | 1 | 1 | 1 | 1 | 1 | 0 | 0 | 0 | 0 | 3.28125 |
| 010001 | 1 | 1 | 1 | 1 | 1 | 1 | 0 | 0 | 0 | 1 | 3.0625 |
| 010010 | 1 | 1 | 1 | 1 | 1 | 1 | 0 | 0 | 1 | 0 | 2.84375 |
| 010011 | 1 | 1 | 1 | 1 | 1 | 1 | 0 | 0 | 1 | 1 | 2.625 |
| 010100 | 1 | 1 | 1 | 1 | 1 | 1 | 0 | 1 | 0 | 0 | 2.40625 |
| 010101 | 1 | 1 | 1 | 1 | 1 | 1 | 0 | 1 | 0 | 1 | 2.1875 |
| 010110 | 1 | 1 | 1 | 1 | 1 | 1 | 0 | 1 | 1 | 0 | 1.96875 |
| 010111 | 1 | 1 | 1 | 1 | 1 | 1 | 0 | 1 | 1 | 1 | 1.75 |
| 011000 | 1 | 1 | 1 | 1 | 1 | 1 | 1 | 0 | 0 | 0 | 1.53125 |
| 011001 | 1 | 1 | 1 | 1 | 1 | 1 | 1 | 0 | 0 | 1 | 1.3125 |
| 011010 | 1 | 1 | 1 | 1 | 1 | 1 | 1 | 0 | 1 | 0 | 1.09375 |
| 011011 | 1 | 1 | 1 | 1 | 1 | 1 | 1 | 0 | 1 | 1 | 0.875 |
| 011100 | 1 | 1 | 1 | 1 | 1 | 1 | 1 | 1 | 0 | 0 | 0.65625 |
| 011101 | 1 | 1 | 1 | 1 | 1 | 1 | 1 | 1 | 0 | 1 | 0.4375 |
| 011110 | 1 | 1 | 1 | 1 | 1 | 1 | 1 | 1 | 1 | 0 | 0.21875 |
| 011111 | 1 | 1 | 1 | 1 | 1 | 1 | 1 | 1 | 1 | 1 | 0.0 |
| 100000 | 1 | 1 | 1 | 1 | 1 | 1 | 1 | 1 | 1 | 1 | 0.0 |
| 100001 | 1 | 1 | 1 | 1 | 0 | 1 | 1 | 1 | 1 | 1 | 0.21875 |
| 100010 | 1 | 1 | 1 | 0 | 1 | 1 | 1 | 1 | 1 | 1 | 0.4375 |
| 100011 | 1 | 1 | 1 | 0 | 0 | 1 | 1 | 1 | 1 | 1 | 0.65625 |
| 100100 | 1 | 1 | 0 | 1 | 1 | 1 | 1 | 1 | 1 | 1 | 0.875 |
| 100101 | 1 | 1 | 0 | 1 | 0 | 1 | 1 | 1 | 1 | 1 | 1.09375 |
| 100110 | 1 | 1 | 0 | 0 | 1 | 1 | 1 | 1 | 1 | 1 | 1.3125 |
| 100111 | 1 | 1 | 0 | 0 | 0 | 1 | 1 | 1 | 1 | 1 | 1.53125 |
| 101000 | 1 | 0 | 1 | 1 | 1 | 1 | 1 | 1 | 1 | 1 | 1.75 |
| 101001 | 1 | 0 | 1 | 1 | 0 | 1 | 1 | 1 | 1 | 1 | 1.96875 |
| 101010 | 1 | 0 | 1 | 0 | 1 | 1 | 1 | 1 | 1 | 1 | 2.1875 |
| 101011 | 1 | 0 | 1 | 0 | 0 | 1 | 1 | 1 | 1 | 1 | 2.40625 |
| 101100 | 1 | 0 | 0 | 1 | 1 | 1 | 1 | 1 | 1 | 1 | 2.625 |
| 101101 | 1 | 0 | 0 | 1 | 0 | 1 | 1 | 1 | 1 | 1 | 2.84375 |
| 101110 | 1 | 0 | 0 | 0 | 1 | 1 | 1 | 1 | 1 | 1 | 3.0625 |
| 101111 | 1 | 0 | 0 | 0 | 0 | 1 | 1 | 1 | 1 | 1 | 3.28125 |
| 110000 | 0 | 1 | 1 | 1 | 1 | 1 | 1 | 1 | 1 | 1 | 3.5 |
| 110001 | 0 | 1 | 1 | 1 | 0 | 1 | 1 | 1 | 1 | 1 | 3.71875 |
| 110010 | 0 | 1 | 1 | 0 | 1 | 1 | 1 | 1 | 1 | 1 | 3.9375 |
| 110011 | 0 | 1 | 1 | 0 | 0 | 1 | 1 | 1 | 1 | 1 | 4.15625 |
| 110100 | 0 | 1 | 0 | 1 | 1 | 1 | 1 | 1 | 1 | 1 | 4.375 |
| 110101 | 0 | 1 | 0 | 1 | 0 | 1 | 1 | 1 | 1 | 1 | 4.59375 |
| 110110 | 0 | 1 | 0 | 0 | 1 | 1 | 1 | 1 | 1 | 1 | 4.8125 |
| 110111 | 0 | 1 | 0 | 0 | 0 | 1 | 1 | 1 | 1 | 1 | 5.03125 |
| 111000 | 0 | 0 | 1 | 1 | 1 | 1 | 1 | 1 | 1 | 1 | 5.25 |
| 111001 | 0 | 0 | 1 | 1 | 0 | 1 | 1 | 1 | 1 | 1 | 5.46875 |
| 111010 | 0 | 0 | 1 | 0 | 1 | 1 | 1 | 1 | 1 | 1 | 5.6875 |
| 111011 | 0 | 0 | 1 | 0 | 0 | 1 | 1 | 1 | 1 | 1 | 5.90625 |
| 111100 | 0 | 0 | 0 | 1 | 1 | 1 | 1 | 1 | 1 | 1 | 6.125 |
| 111101 | 0 | 0 | 0 | 1 | 0 | 1 | 1 | 1 | 1 | 1 | 6.34375 |
| 111110 | 0 | 0 | 0 | 0 | 1 | 1 | 1 | 1 | 1 | 1 | 6.56250 |
| 111111 | 0 | 0 | 0 | 0 | 0 | 1 | 1 | 1 | 1 | 1 | 6.78125 |

Figure 10

DIGITALLY PROGRAMMABLE I/Q PHASE OFFSET COMPENSATION

BACKGROUND

1. Field of the Invention

Embodiments of the invention relate to frequency synthesizer circuits, and more particularly to adjustment of the phases of I and Q signals produced by frequency synthesizer circuits.

2. Related Technology

Frequency synthesizer circuits are widely used to generate local oscillator signals in radio frequency (RF) transmitter and receiver devices. Frequency synthesizers are typically implemented as phase locked loops. FIG. 1 shows an example of a conventional phase locked loop frequency synthesizer. The primary frequency generating element of the phase locked loop is a voltage controlled oscillator 10 that produces an output frequency corresponding to a charge stored in a low pass filter 12. The charge in the low pass filter 12 is controlled by a charge pump 14 that drives current into or out of the low pass filter 12 in response to a control signal provided by a phase frequency detector 16. The phase frequency detector 16 produces the control signal based on comparison of a signal representing the frequency of the voltage controlled oscillator to a signal representing a reference frequency. The signal representing the reference frequency is generated by dividing the signal from a reference frequency generator 18 such as a crystal oscillator using a frequency divider 20. The signal representing the frequency of the voltage controlled oscillator 10 is also divided by a frequency divider 22 so that the frequencies compared by the phase frequency detector 16 are approximately the same when the voltage controlled oscillator 10 is producing the desired frequency.

It is often necessary for the frequency synthesizer to generate both in-phase (I) and quadrature (Q) signals. To do so, the frequency synthesizer typically employs a frequency divider 24 that divides the output of the voltage controlled oscillator 10 by a factor of four. This produces a 0 degree output signal having a frequency that is one-quarter the frequency of the VCO 10, and additional signals at the same frequency with edges at 90 degrees, 180 degrees, and 270 degrees with respect to the 0 degree output signal. The 0 degree and 180 degrees signals constitute a differential in-phase signal pair, and the 90 degree and 270 degree signals constitute a differential quadrature signal pair.

Present generation RF devices such as wireless LAN transceivers operate at a very high frequencies and require very high local oscillator frequencies. For example, wireless LAN transceivers that support the 801.11 b/g standards must be capable of modulating and demodulating signals in the range of 2.412 GHz to 2.84 GHz, and transceivers that support the 802.11 a/j standards must be capable of modulating and demodulating signals in the range of 4.912 GHz to 5.805 GHz, At these frequencies, propagation delays and component mismatches within the transceiver circuit can introduce significant phase offsets between the in-phase and quadrature signals of the local oscillator when measured at a component such as a mixer that receives those signals. FIG. 2 shows an example of in-phase and quadrature signals in which a phase offset has delayed the quadrature signal with respect to the in-phase signal. This is a significant problem for local oscillator signals since a phase offset between the in-phase and quadrature inputs of a mixer will degrade the accuracy of modulation or demodulation performed by the mixer.

A common way of addressing the phase offset problem is to selectively increase the lengths of the transmission lines that carry the local oscillator signals so that phase offsets are compensated by additional path-related delays, and to space out nearby devices. However this increases the routing area of the device, which is contrary to the typical objective of reducing circuit size, and increases power consumption because more power is required for the frequency synthesizer to drive the lengthened transmission lines at high frequencies. Therefore this approach is particularly undesirable in circuits intended for small, portable devices such as wireless LAN transceivers, cell phones, GPS receivers and other similar devices. This approach is also undesirable because the phase shift adjustment is hard wired, and therefore may not provide appropriate compensation for phase offsets that are not predicted during the design stage, such as offsets introduced during layout or fabrication, or offsets that are influenced by the environment in which the circuit is used.

One alternative way of correcting phase offset is through manipulation of the current sources in the frequency divider that produces the signals to adjust the edges of the output signals. While this can improve phase offset, it prevents the use of a resynchronization element at the output of the frequency divider to reduce phase noise generated by the frequency divider.

Another alternative way of addressing the phase offset problem is to use metal-insulator-metal (MiM) capacitors to produce delays in the leading and trailing edges of differential signals.

A first conventional phase offset compensation circuit using MiM capacitors is shown in FIG. 3. In this circuit, each of the differential signal lines 100, 102 may be connected to a voltage source and to ground through MiM capacitors 104, 106, 108, 110. The connections to the voltage source are switched by PMOS transistors 112, 114, and the connections to ground are switched by NMOS capacitors 116, 118. During operation, the PMOS and NMOS transistors are switched at the frequency of the differential signals to shift the positions of the signal transitions. However this circuit has several disadvantages. Signal power is lost because the circuit couples the signal lines to a voltage source or to ground. Also, the effect of coupling the signal lines to the voltage source is not symmetrical with the effect of coupling the signal lines to ground, which distorts the signal waveform and limits the effectiveness of the phase compensation, The switches in the circuit also generate significant switching noise at the power supply.

A second conventional phase offset compensation circuit using MiM capacitors is shown in FIG. 4. In this circuit, a switchable capacitance provided by MiM capacitors 120, 122 and an n-type or p-type MOS transistor 124 is coupled between the differential signal lines 100, 102. The capacitance may be switched into the circuit to create a delay in the differential signals. As shown in FIG. 5, delaying one of the signal pairs produces an offset between the signals that can compensate a pre-existing offset in the signals. However, because MiM capacitors are relatively large, their minimum capacitance is limited, which in turn limits the phase resolution provided by this circuit. Also, the impedance of the transistor 124 may be significantly larger than that of the capacitors 120, 122, and its on resistance is at a maximum during the middle of the transition of the signals. This limits the frequency at which this circuit is effective for providing useful phase offset compensation.

SUMMARY

Embodiments of the invention produce delays in differential signals using a variable capacitance provided by MOS varactors coupled between the differential signals. The capacitance of the MOS varactors is controlled by a bias voltage applied to the bodies of the varactors. Selective application of bias voltages to the MOS varactors may be employed to selectively delay one pair of differential signals with respect to another pair of differential signals so as to change the relative phases of the signals. A logic circuit may be used to control the application of bias voltage to the MOS varactors so that signal phases may be adjusted in a manner that is predictable and programmable. Embodiments of the invention may be implemented to compensate for phase offsets between in-phase and quadrature signals of a local oscillator.

DESCRIPTION OF THE DRAWINGS

FIG. 10 shows a table of varactor array states and phase compensation values for one embodiment of the invention.

DETAILED DESCRIPTION

Figure 1:
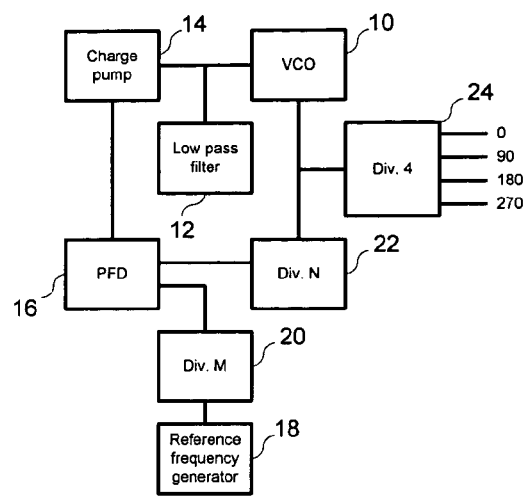
FIG. 1 shows a conventional phase locked loop circuit.
Figure 2:
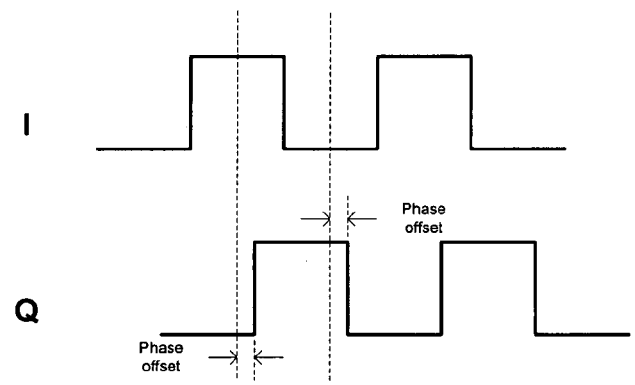
FIG. 2 shows an example of a phase offset between an in-phase signal and a quadrature signal.
Figure 3:
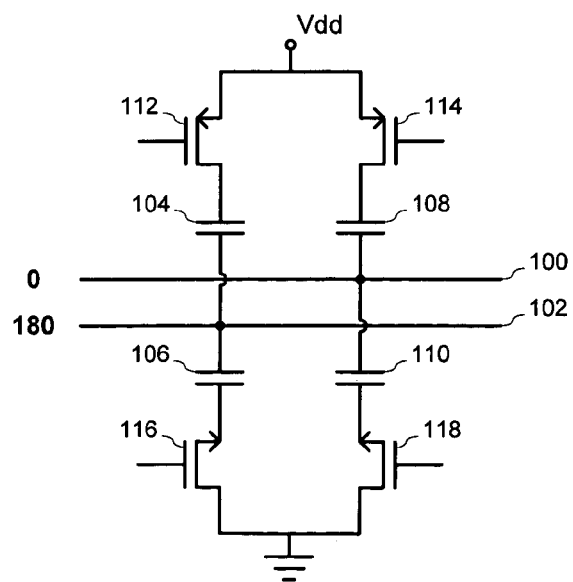
FIG. 3 shows a first example of a conventional phase offset compensation circuit.
Figure 4:
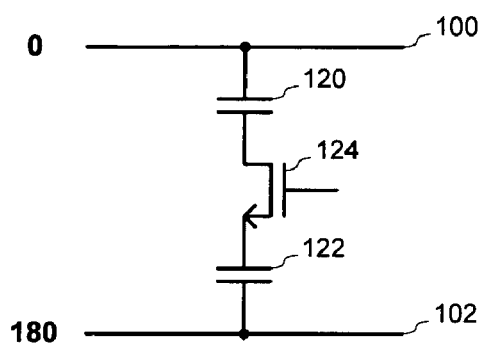
FIG. 4 shows a second example of a conventional phase offset compensation circuit.
Figure 5:
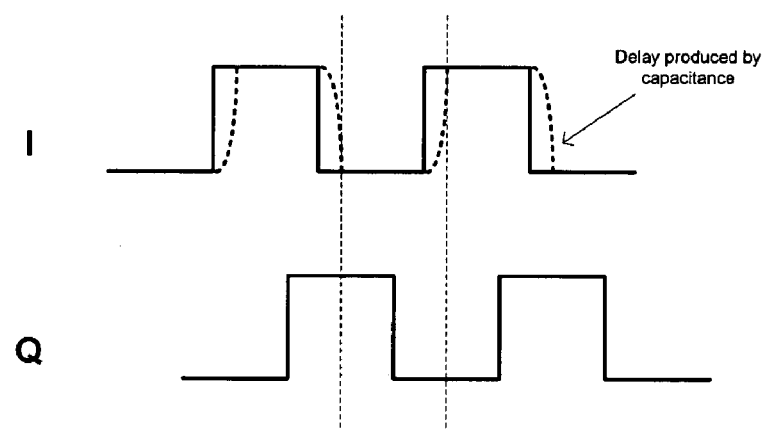
FIG. 5 shows an example of phase offset compensation provided by a delay produced by a capacitance coupled between signals of a differential signal pair.
Figure 6:
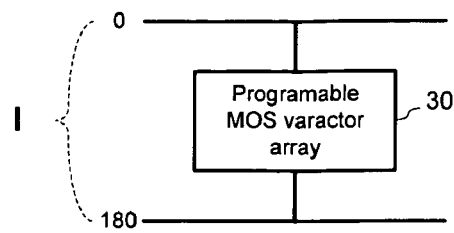
FIG. 6 shows a high level diagram of a programmable phase offset compensation circuit using programmable MOS varactor arrays in accordance with one embodiment of the invention.

FIG. 6 shows a high level diagram of a programmable phase offset compensation circuit in accordance with one embodiment of the invention. In this embodiment, programmable MOS varactor arrays 30, 32 are coupled between the differential signal pairs of the in-phase and quadrature signals produced by a frequency synthesizer circuit such as the circuit of FIG. 1. Each of the MOS varactor arrays 30, 32 provides a capacitance having a variable value that may be programmed to a specific value as described herein. Different values may selected for each array so that each array creates a different amount of delay in its corresponding signals. A phase offset may be compensated by selecting appropriate values for each array. For example, a phase offset between in-phase and quadrature signals may be measured at the input of a mixer that receives those signals, and the capacitance values of the varactor arrays 30, 32 may then be set to produce delays in their corresponding signals in amounts that compensate the measured phase offset.

Figure 7:
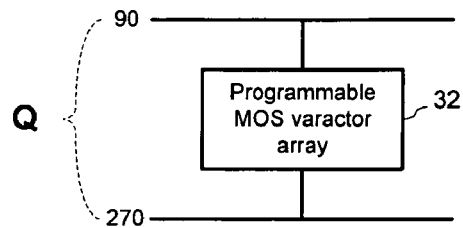
FIG. 7 shows a cross section of a pair of MOS varactors of the programmable MOS varactor array for one embodiment of the invention.
Figure 7:
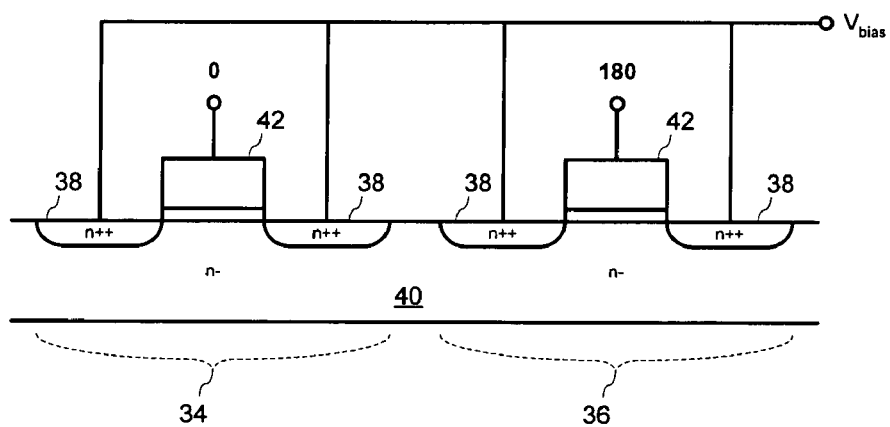

FIG. 7 shows a cross section of a pair of MOS varactors that may be utilized to produce a variable capacitance in a programmable MOS varactor array. The MOS varactors are implemented as MOS devices 34, 36 having n-type source and drain regions 38 formed in an n-well body 40. The gates 42 of the MOS varactors are connected to respective signals of a differential signal pair. A bias voltage $V_{bias}$ is applied to the n-well body 40 through the source and drain regions 38. Each MOS varactor provides a capacitance between the gate 42 and the n-well body 40, and thus the two MOS varactors behave as a pair of series-connected capacitors coupled between the differential signals.

Figure 8:
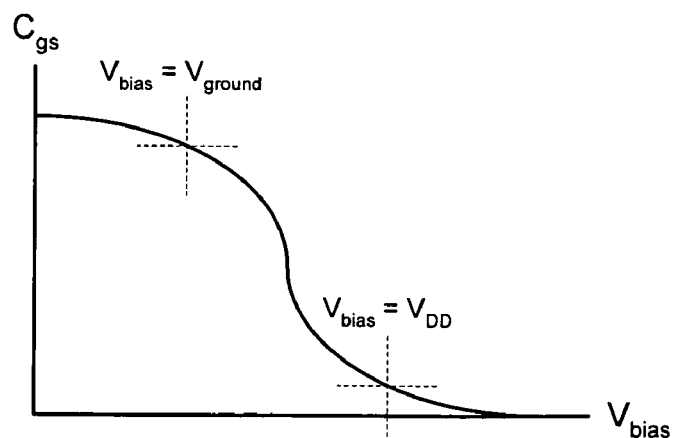
FIG. 8 shows a graph relating the capacitance of the MOS varactors of FIG. 5 to a bias voltage applied to the bodies of the varactors.

The capacitance of each MOS varactor is determined by the voltage applied to the gate and the bias voltage Vbias applied to the body. Because the signals applied to the gates are periodic signals with essentially constant peak to peak amplitudes, the contribution of the gate signals to the varactor capacitance is effectively determined by the average values of the gate signals and may be treated as a constant. Thus the capacitance of the varactors may be predictably controlled by varying the bias voltage $V_{bias}$. As shown in FIG. 8, an increase in the bias voltage $V_{bias}$ decreases the capacitance of the varactor. In one embodiment, $V_{bias}$ is set to either a supply voltage $V_{DD}$ or ground, thus allowing the capacitance to be switched between two essentially fixed values.

Figure 9:
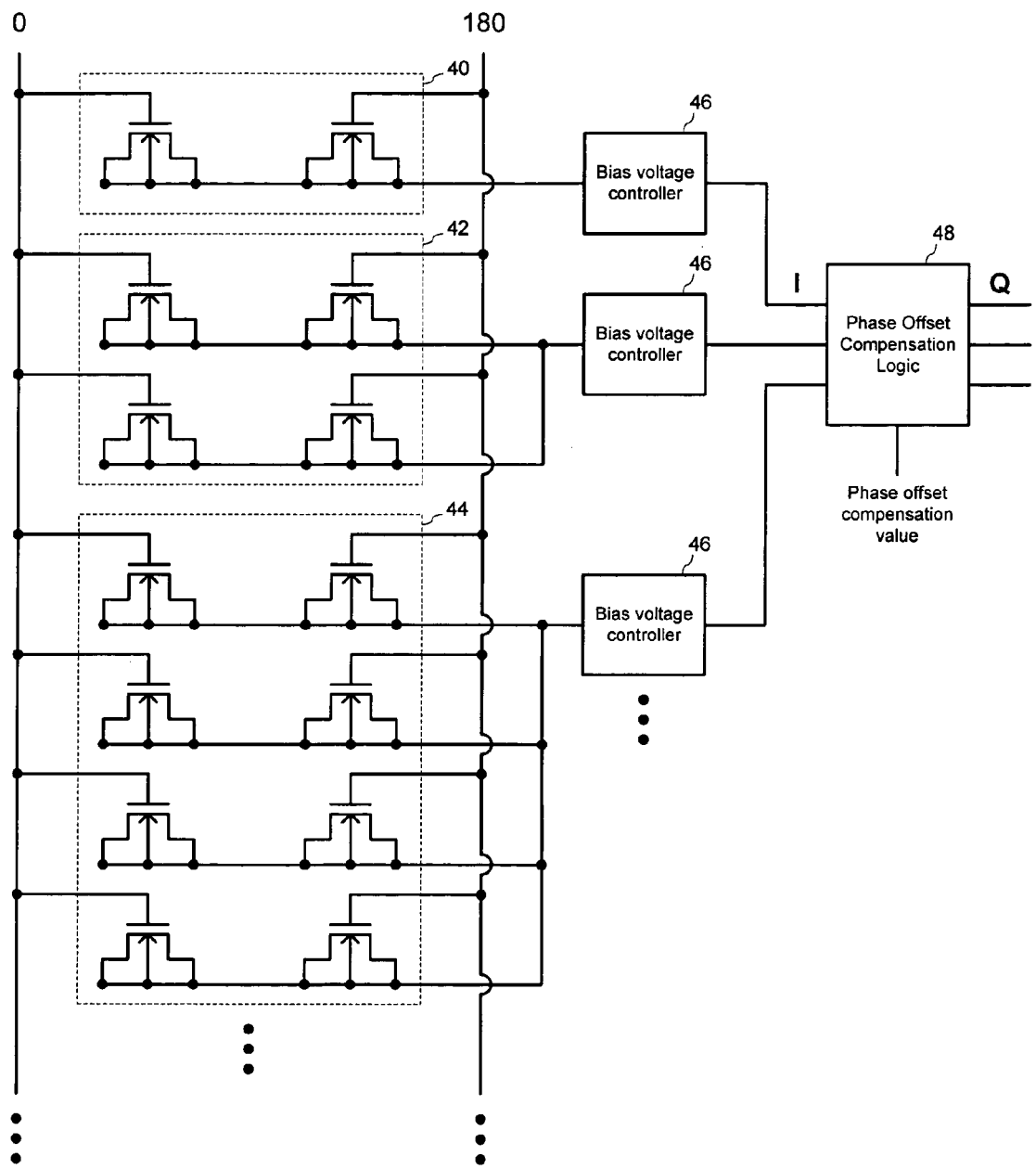
FIG. 9 shows details of a section of a programmable MOS varactor array for one embodiment of the invention.

Programmable arrays of MOS varactors may be implemented in a variety of manners. A section of a programmable MOS varactor array of one embodiment is shown in FIG. 9. The array is comprised of sets 40, 42, 44 of MOS varactor pairs such as those shown in FIG. 7. The MOS varactors are implemented as matched devices so that their parameters are as identical as possible within typical processing tolerances, and the number of MOS varactor pairs in each set increases in a binary fashion. For example, the array of FIG. 9 includes a set of one MOS varactor pair 40, a set of two MOS varactor pairs 42, and a set of four MOS varactor pairs 44. Although not shown in FIG. 9, it is preferred that the array also includes additional sets of 8 MOS varactor pairs and 16 MOS varactor pairs, and corresponding bias voltage controllers. Each set of MOS varactor pairs is coupled to a respective bias voltage controller 46 that applies a bias voltage $V_{bias}$ to the bodies of the varactors to set the capacitance value provided by each set. In this embodiment, the bias voltage controllers switch the bias voltage $V_{bias}$ between predetermined high and low voltages so as to switch the capacitance provided by each varactor pair between predetermined low and high capacitance values. Thus the array allows the value of the capacitance coupled between the signal lines to be adjusted in predetermined increments in a binary fashion, with the number of increments being determined by the number of sets of varactor pairs in the array, and the specific capacitance values provided by each varactor pair being determined by the size and doping properties of the individual matched varactors and the values of the predetermined high and low voltages applied to each varactor pair. In the embodiment of FIG. 9, with sets of 8 and 16 MOS varactor pairs additionally provided, the array enables the selection of any of 32 distinct and approximately equally spaced capacitance values.

The operation of the bias voltage controllers 46 is controlled by phase offset compensation logic 48 that receives a phase offset compensation value indicating an amount of delay to be produced in the I and Q signals. In one embodiment, the phase offset compensation value is a six bit data word, and the phase offset compensation logic is comprised of logic for translating the phase offset compensation value into bits representing states of each of the bias voltage controllers of the programmable MOS varactor arrays, and a register for storing those bits. FIG. 10 shows a table of phase offset compensation values and corresponding bias voltage controller states for this embodiment of the invention. In this embodiment, the most significant bit of the phase offset compensation value indicates which of the I and Q signals is to be delayed, and the remaining bits represent the states of the bias voltage controllers corresponding to that signal. As seen at the top of the table, for the phase offset compensation value 000000, the most significant bit 0 indicates that the Q signal is to be delayed. The remaining bits 00000 represent the states of the Q signal bias voltage controllers. The values 00000 cause all of the bias voltage controllers for the Q signal to be set to 1, indicating that $V_{bias}$ is low and all of the Q varactor pair sets are set to a high capacitance value. The states of all of the bias voltage controllers for the I signal are set to 1, indicating that $V_{bias}$ is high and all of the I varactor pair sets are set to a low capacitance value. These states produce the maximum delay in the Q signal. As seen at the bottom of the table, for the phase offset compensation value 111111, the most significant bit 1 indicates that the I signal is to be delayed. The remaining bits 11111 cause all of the bias voltage controllers for the I signal to be set to 1, indicating that $V_{bias}$ is low and all I varactor pair sets are set to a high capacitance value. The states of all of the bias voltage controllers for the Q signal are set to 1, indicating that $V_{bias}$ is high and all of the Q varactor pair sets are set to low capacitance value. These states produce the maximum delay in the I signal. Values between 000000 and 111111 produce intermediate delays in the I or Q signals. Values of 011111 and 100000 produce minimum capacitance for both the I and Q varactor pair sets and produce no delay between the I and Q signals. This setting is advantageous because both the I and Q signals see the minimum capacitance with minimum noise added to the signals.

The embodiment represented by the table of FIG. 10 is designed to provide phase offset compensation for a local oscillator signal centered at approximately 800 MHz, and the parameters of the varactor pairs are selected such that the varactor pairs provide a capacitance of approximately 2 femtofarads when $V_{bias}$ is set to $V_{DD}$ and a capacitance of approximately 3 femtofarads when $V_{bias}$ is set to ground. Consequently the programmable MOS varactor array provides a variable capacitance that is programmable to values from 62 femtofarads to 93 femtofarads in increments of 1 femtofarad. As shown in the right-hand column of the truth table, this translates to a phase resolution of 0.21875 degrees and a maximum delay of 6.78125 degrees that may be applied to either the I or Q signal. Those having ordinary skill in the art will be capable of implementing circuits providing different phase resolutions and phase adjustment ranges through selection of the parameters of the individual varactors and the sets of varactor pairs, and the voltages applied to the varactors.

Figure 11:
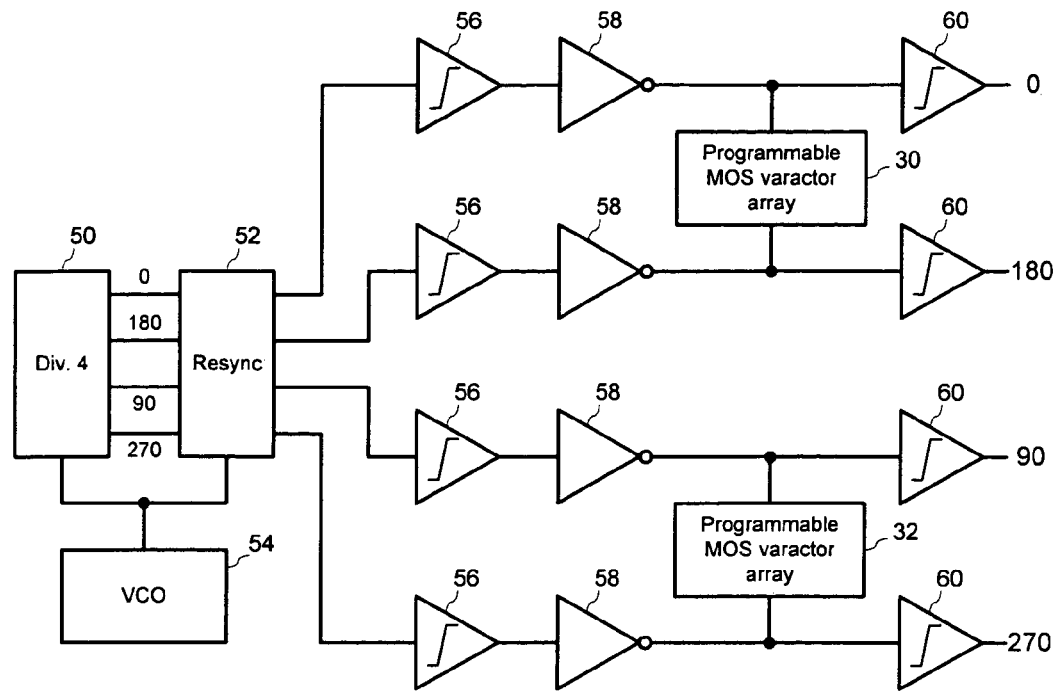
FIG. 11 shows a phase offset compensation circuit in accordance with a preferred embodiment.

FIG. 11 shows features of one implementation of a phase offset compensation circuit in accordance with the invention. In this implementation, differential in-phase and quadrature signals are generated by a frequency divider 50. The signals are supplied to a resynchronization block 52 that removes delay mismatch and noise produced by the divider 50, and provides a small load which improves the speed of the divider 50. The divider 50 and the resynchronization block 52 are driven by a voltage controlled oscillator 54 of a phase locked loop such as the one illustrated in FIG. 1. The differential signals supplied by the resynchronization block 52 are received by level shifters 56 that convert the input signals to rail-to-rail voltages. The signals from the level shifters 56 are supplied to inverters 58 and then to the respective MOS varactor arrays 30, 32 where the signals are selectively delayed in accordance with the capacitance values set by the phase offset compensation logic 48. Output signals are supplied by an additional set of level shifters 60. This implementation is advantageous in that it allows resynchronization to be performed on the differential signal pairs before phase offset compensation is applied, and provides level shifting before and after the phase offset compensation so that phase noise and signal loss due to the programmable MOS varactor arrays are minimal.

Figure 12:
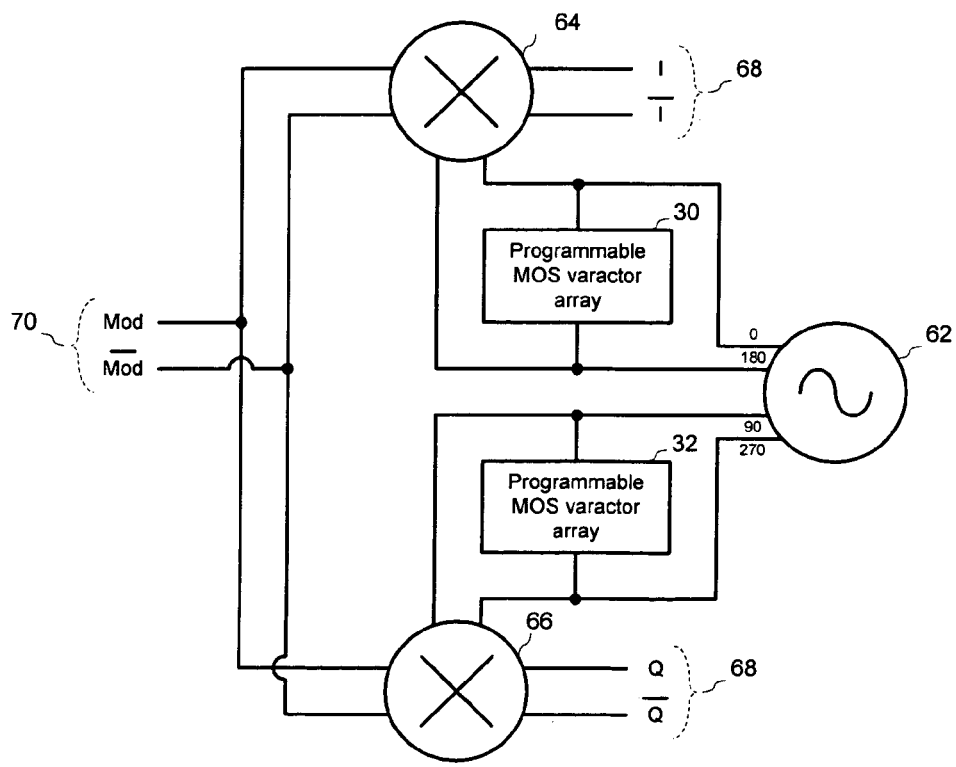
FIG. 12 shows an implementation of a phase offset compensation circuit in circuit for modulating or demodulating a signal.

An implementation of a phase offset compensation circuit in a circuit for modulating or demodulating signal in accordance with one embodiment of the invention is shown in FIG. 12. In this circuit, a frequency synthesizer 62 such as the phase locked loop of FIG. 1 generates differential in-phase and quadrature local oscillator signals, which are supplied to respective mixers 64, 66. The mixers 64, 66 are also coupled to differential in-phase and quadrature data signals 68 and to differential modulated signals 70. Programmable MOS varactor arrays 30, 32 are coupled between the respective local oscillator differential signal pairs to provide any necessary phase offset compensation so that the phase offset of the in-phase and quadrature local oscillator signals at the respective mixers is as close as possible to ninety degrees. Depending on the configuration of the mixer, the data signals may be mixed with the local oscillator signals to produce the modulated signals, or the modulated signals may be mixed with the local oscillator signals to produce the data signals. The illustrated circuit may be implemented as a mixing stage of a direct conversion transmitter or receiver for converting between RF and baseband signals, or may be implemented as a mixing stage in a multistage transmitter or receiver.

Figure 13A:
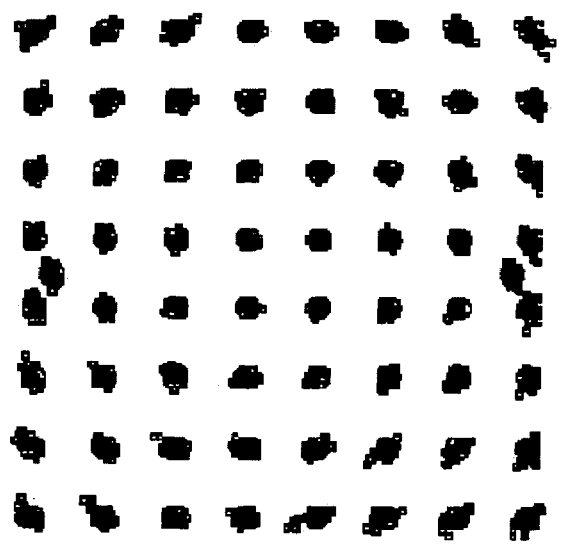
FIGS. 13a and 13b shows symbol constellations of a quadrature amplitude modulation circuit without phase offset compensation and with phase offset compensation.
Figure 13B:
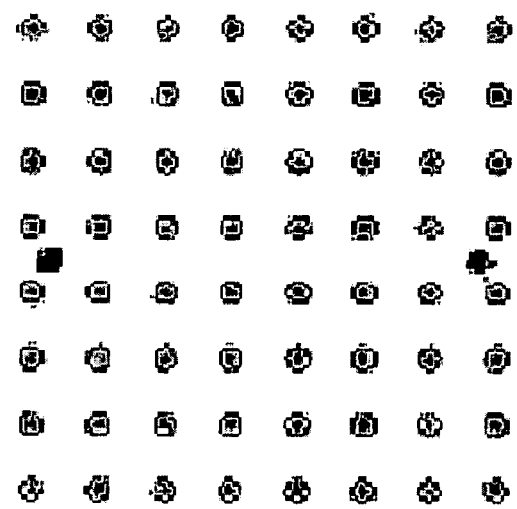

FIGS. 13a and 13b show scatter plots of quadrature amplitude modulation (QAM) symbol constellations without phase offset compensation and with phase offset compensation. The symbol constellation of FIG. 13a is produced by a transmitter circuit that modulates a carrier in the range of 5 GHz and that has a phase offset of approximately 2 degrees between the I and Q local oscillator signals that are received by a mixer in the transmitter. The scatter plot of this symbol constellation shows that the symbols are subjected to a rotational bias, sometimes referred to as "phase jitter," that increases the chance of erroneous decisions regarding the symbol values during receiver baseband processing. The symbol constellation of FIG. 13b is produced by the same receiver after application of phase compensation by a circuit such as the circuit of FIG. 9 to compensate for the 2 degree phase offset of the original circuit. As seen in FIG. 13b, the phase offset compensation substantially minimizes the phase jitter of FIG. 13a, resulting in greater accuracy of symbol transmission.

The phase offset compensation circuits described herein may be controlled in a variety of manners. In some embodiments the phase offset of a local oscillator signal may measured after fabrication of the circuit and a phase offset compensation value for correcting any detected phase offset may be established once for the circuit. This phase offset compensation value may be supplied to the phase offset compensation logic by a software process of a device in which the circuit is implemented, or may be stored in a non-volatile memory element within the device in which the circuit is implemented. In some alternative embodiments, the phase offset of a local oscillator may be actively measured during device operation, and the device may recalibrate the phase offset compensation value in accordance with any detected change in offset. In other alternative embodiments, the phase offset compensation value may be changed upon a change in the frequency of the local oscillator. For example, in a transceiver device having a variable quadrature local oscillator that operates at high frequencies, the sweep range of the local oscillator may be large enough that the offset between the in-phase and quadrature signals is different at the extremes of the sweep range. In this case, different phase offset compensation values may be associated with different oscillator frequencies, and the value supplied to the programmable MOS varactor arrays may be changed in accordance with changes in the oscillator frequency.

While various embodiments have been described herein, a variety of alternatives may be implemented. For example, in the various embodiments described herein, the bias voltage controllers switch the bias voltage $V_{bias}$ applied to the varactor bodies between a supply voltage $V_{DD}$ and ground. However in alternative embodiments the range of the capacitance values may be extended by generating voltages that exceed the supply voltage or that are lower than the ground voltage and applying those voltages to the varactor bodies.

The phase offset compensation circuits disclosed herein may be employed in any device in which it is desired to effect a phase change between two pairs of differential signals. Typically the phase offset compensation circuit will be implemented to provide phase compensation for the I and Q signals of local oscillator circuits. The phase compensation circuit may be implemented in a variety of devices that employ local oscillators of this type, such as wireless networking devices, cellular phones, personal digital assistants with wireless communication capabilities, GPS receivers, and other devices in which RF signals are modulated or demodulated.

The phase offset compensation circuits disclosed herein may provide a number of advantages over conventional phase offset compensation technologies. The MOS varactors occupy very little space and provide phase compensation with essentially no power loss. They are extremely quiet and contribute very little noise to the oscillator signals. Further, the capacitance values provided by the MOS varactors may be very small and are limited only by the processing technology that is used to produce them. Therefore, by employing a very small design rule, a fine phase resolution may be obtained, even for very high frequency signals. The number of varactor pairs may also be scaled up to provide any desired range of phase offset compensation.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other purposes. Thus it should be understood that the embodiments illustrated in the figures and described above are offered by way of example only. The invention is not limited to a particular embodiment, but extends to various modifications, combinations, and permutations that fall within the scope of the claims and their equivalents.

What is claimed is:

1. A frequency synthesizer circuit comprising:
  a phase locked loop having a voltage controlled oscillator producing an output frequency;
  a frequency divider receiving the output frequency of the voltage controlled oscillator and producing differential in-phase and quadrature signals; and
  a phase offset compensation circuit for compensating a phase offset between the in-phase and quadrature signals, the phase offset compensation circuit comprising:
    first pairs of series connected MOS varactors, each pair coupled between transmission lines of said in-phase differential signals;
    a first group of bias voltage controllers, each of said bias voltage controllers applying respective bias voltages to bodies of respective sets of said first pairs of MOS varactors;
    second pairs of series connected MOS varactors, each pair coupled between transmission lines of said quadrature differential signals;
    a second group of bias voltage controllers, each of said bias voltage controllers applying respective bias voltages to bodies of respective sets of said second pairs of MOS varactors; and
    a phase offset compensation logic circuit controlling the bias voltage controllers of the first and second groups in response to a phase offset compensation value received by the logic circuit to adjust the relative phases of the in-phase and quadrature signals.

2. The circuit claimed in claim 1, wherein said MOS varactors are coupled between said transmission lines at their respective gates, and
  wherein said respective bias voltages are applied to said bodies of said MOS varactors through source and drain regions of said MOS varactors.

3. The circuit claimed in claim 1, wherein the sets of said first pairs of MOS varactors contain respective numbers of pairs of MOS varactors that increase in a binary fashion, and
  wherein the sets of said second pairs of MOS varactors contain respective numbers of pairs of MOS varactors that increase in a binary fashion.

4. The circuit claimed in claim 1, wherein said bias voltage controllers switch the bias voltages applied to the bodies of the MOS varactors between a first voltage producing a first capacitance and a second voltage producing a second capacitance that is higher than the first capacitance.

5. The circuit claimed in claim 4, wherein said first voltage is a supply voltage and said second voltage is a ground voltage.

6. The circuit claimed in claim 4, wherein said first voltage is a voltage that is higher than a supply voltage.

7. The circuit claimed in claim 4, wherein said second voltage is a voltage that is lower than a ground voltage.

8. A circuit for modulating or demodulating a signal, comprising:
  a frequency synthesizer circuit producing differential in-phase and quadrature signals;
  a first mixer receiving the differential in-phase signals and first differential input signals and producing first differential output signals;

a second mixer receiving the differential quadrature signals and second differential input signals and producing second differential output signals; and a phase offset compensation circuit for compensating a phase offset between the in-phase and quadrature signals, the phase offset compensation circuit comprising:

first pairs of series connected MOS varactors, each pair coupled between transmission lines of said in-phase differential signals;

a first group of bias voltage controllers, each of said bias voltage controllers applying respective bias voltages to bodies of respective sets of said first pairs of MOS varactors;

second pairs of series connected MOS varactors, each pair coupled between transmission lines of said quadrature differential signals;

a second group of bias voltage controllers, each of said bias voltage controllers applying respective bias voltages to bodies of respective sets of said second pairs of MOS varactors; and a phase offset compensation logic circuit controlling the bias voltage controllers of the first and second groups in response to a phase offset compensation value received by the logic circuit to adjust the relative phases of the in-phase and quadrature signals.

9. The circuit claimed in claim 8, wherein said MOS varactors are coupled between said differential signals at their respective gates, and wherein said respective bias voltages are applied to said bodies of said MOS varactors through source and drain regions of said MOS varactors.

10. The circuit claimed in claim 8, wherein the sets of said first pairs of MOS varactors contain numbers of pairs of MOS varactors that increase in a binary fashion, and wherein the sets of said second pairs of MOS varactors contain numbers of pairs of MOS varactors that increase in a binary fashion.

11. The circuit claimed in claim 8, wherein said bias voltage controllers switch the bias voltages applied to the bodies of the varactors between a first voltage producing a first capacitance and a second voltage producing a second capacitance that is higher than the first capacitance.

12. The circuit claimed in claim 11, wherein said first voltage is a supply voltage and said second voltage is a ground voltage.

13. The circuit claimed in claim 11, wherein said first voltage is a voltage that is higher than a supply voltage.

14. The circuit claimed in claim 11, wherein said second voltage is a voltage that is lower than a ground voltage.

15. A phase offset compensation circuit for compensating a phase offset between first and second pairs of differential signals, comprising:

first pairs of series connected MOS varactors, each pair coupled between transmission lines of a first of said pairs of differential signals;

a first group of bias voltage controllers, each of said bias voltage controllers applying respective bias voltages to bodies of respective sets of said first pairs of MOS varactors;

second pairs of series connected MOS varactors, each pair coupled between transmission lines of a second of said pairs of differential signals;

a second group of bias voltage controllers, each of said bias voltage controllers applying respective bias voltages to bodies of respective sets of said second pairs of MOS varactors; and a phase offset compensation logic circuit controlling the bias voltage controllers of the first and second groups in response to a phase offset compensation value received by the logic circuit.

16. The circuit claimed in claim 15, wherein the sets of said first pairs of MOS varactors contain respective numbers of pairs of MOS varactors that increase in a binary fashion, and wherein the sets of said second pairs of MOS varactors contain respective numbers of pairs of MOS varactors that increase in a binary fashion.

17. The circuit claimed in claim 15, wherein said bias voltage controllers switch the bias applied to the bodies of the varactors between a first voltage producing a first capacitance and a second voltage producing a second capacitance that is higher than the first capacitance.

18. The circuit claimed in claim 17, wherein said first voltage is a supply voltage and said second voltage is a ground voltage.

19. The circuit claimed in claim 17, wherein said first voltage is a voltage that is higher than a supply voltage.

20. The circuit claimed in claim 17, wherein said second voltage is a voltage that is lower than a ground voltage.

21. The circuit claimed in claim 15, wherein said MOS varactors are coupled between said transmission lines at their respective gates, and wherein said respective bias voltages are applied to said bodies of said MOS varactors through source and drain regions of said MOS varactors.

22. A method for compensating phase offset between differential in-phase and quadrature signals of a frequency synthesizer, comprising:

measuring a phase offset between the differential in-phase and quadrature signals; and selectively applying bias voltages to bodies of series connected MOS varactors coupled between the transmission lines of respective pairs of the differential in-phase signals and the differential quadrature signals to produce a delay in one of said pair of differential in-phase signals and said pair of differential quadrature signals to compensate said measured phase offset.

23. The method claimed in claim 22, wherein said bias voltages are applied by bias voltage controllers under the control of a phase offset compensation logic circuit.

24. The method claimed in claim 22, wherein said phase offset compensation logic circuit controls said bias voltage controllers in accordance with a binary phase offset compensation value received by the logic circuit representing a phase offset compensation to be produced.

25. The method claimed in claim 22, wherein said method of compensating phase offset is performed at startup of a device incorporating the frequency synthesizer using a fixed compensation value determined in advance for the frequency synthesizer.

* * * * *